(12) United States Patent
Onodera

(10) Patent No.: US 9,194,905 B2
(45) Date of Patent: Nov. 24, 2015

(54) PROCESSING CIRCUIT HAVING SELF-DIAGNOSIS FUNCTION

(71) Applicants: DENSO CORPORATION, Kariya, Aichi-pref. (JP); Advics Co., Ltd., Kariya, Aichi-pref. (JP)

(72) Inventor: Ken Onodera, Nagoya (JP)

(73) Assignees: DENSO CORPORATION, Kariya, Aichi-pref.; ADVICS CO., LTD., Kariya, Aichi-pref.

(*) Notice: Subject to any disclaimer, the term of this patent is extended or adjusted under 35 U.S.C. 154(b) by 64 days.

(21) Appl. No.: 14/243,032

(22) Filed: Apr. 2, 2014

(65) Prior Publication Data
US 2014/0300377 A1    Oct. 9, 2014

(30) Foreign Application Priority Data

Apr. 3, 2013 (JP) ................. 2013-077929

(51) Int. Cl.
*G01R 31/28* (2006.01)
*G01R 31/02* (2006.01)
*G01R 31/30* (2006.01)

(52) U.S. Cl.
CPC .......... *G01R 31/026* (2013.01); *G01R 31/3004* (2013.01)

(58) Field of Classification Search
None
See application file for complete search history.

(56) References Cited

U.S. PATENT DOCUMENTS

| | | | | |
|---|---|---|---|---|
| 5,825,234 | A * | 10/1998 | Sung et al. | 327/378 |
| 6,552,562 | B2 * | 4/2003 | Nagai et al. | 324/756.06 |
| 7,956,789 | B2 | 6/2011 | Ushie | |
| 8,610,613 | B2 | 12/2013 | Ebata et al. | |
| 2010/0245141 | A1 | 9/2010 | Ushie | |
| 2011/0074612 | A1 | 3/2011 | Ariyoshi et al. | |
| 2012/0176141 | A1 | 7/2012 | Mikami et al. | |
| 2012/0212362 | A1 | 8/2012 | Ebata et al. | |

FOREIGN PATENT DOCUMENTS

| | | |
|---|---|---|
| JP | 2000-055966 | 2/2000 |
| JP | 2006-345237 | 12/2006 |
| JP | 2010-093538 | 4/2010 |
| JP | 2010-237079 | 10/2010 |
| JP | 2011-077847 | 4/2011 |
| JP | 2012-145409 | 8/2012 |
| JP | 2012-145410 | 8/2012 |
| JP | 2012-145411 | 8/2012 |
| JP | 2012-175287 | 9/2012 |

\* cited by examiner

*Primary Examiner* — Minh N Tang
(74) *Attorney, Agent, or Firm* — Harness, Dickey & Pierce, P.L.C.

(57) ABSTRACT

A processing circuit has an input terminal to which an input signal generated by an input signal generator is inputted via an input line. An external capacitor is connected to the input line in parallel with the processing circuit. The processing circuit includes a pulse circuit, at least one switch, a controller, a detector and a determiner. The pulse circuit generates a pulsed voltage having at least one pulse. The least one switch is provided between the pulse circuit and the input line. The controller controls the at least one switch so as to apply the pulsed voltage to the input line via a resistor. The detector detects a change in a voltage of the input line caused by application of the pulsed voltage to the input line. The determiner determines whether the processing circuit is in a normal or abnormal condition based on the change detected by the detector.

8 Claims, 4 Drawing Sheets

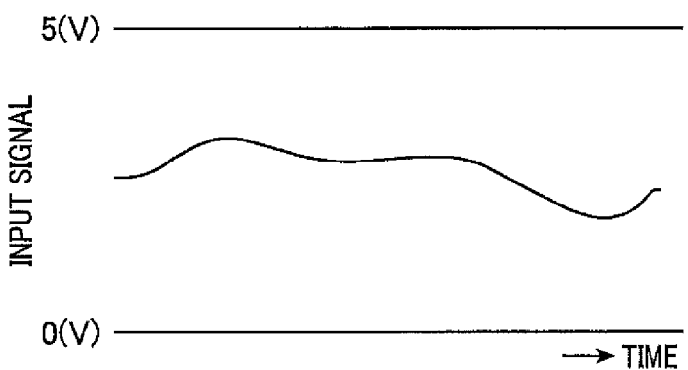
FIG.2
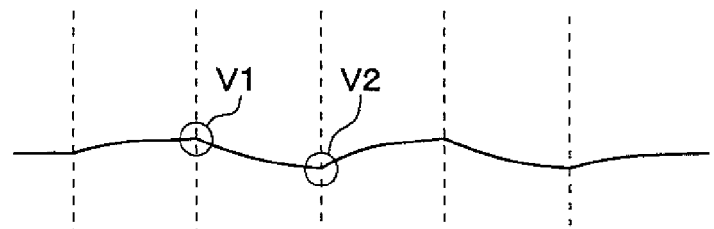
FIG.3
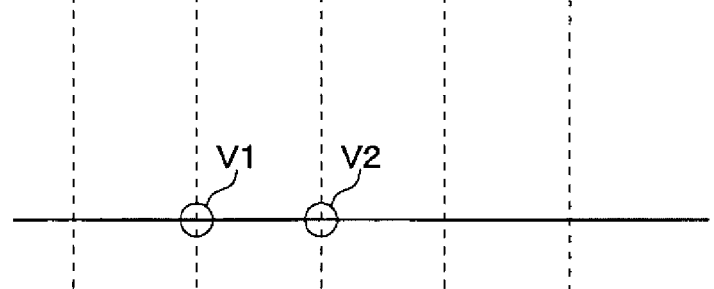
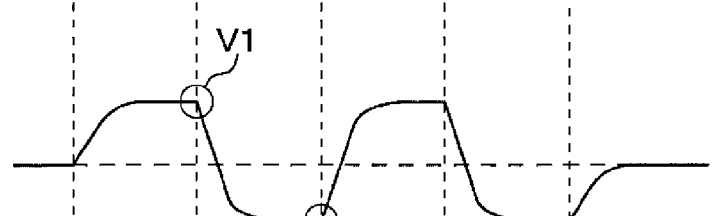
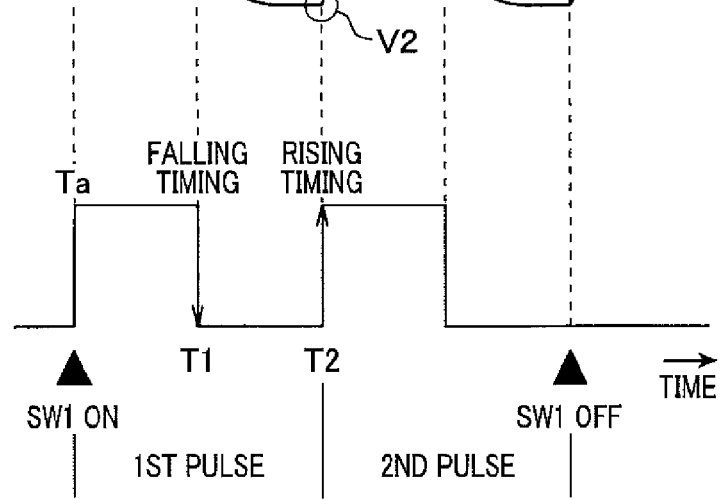

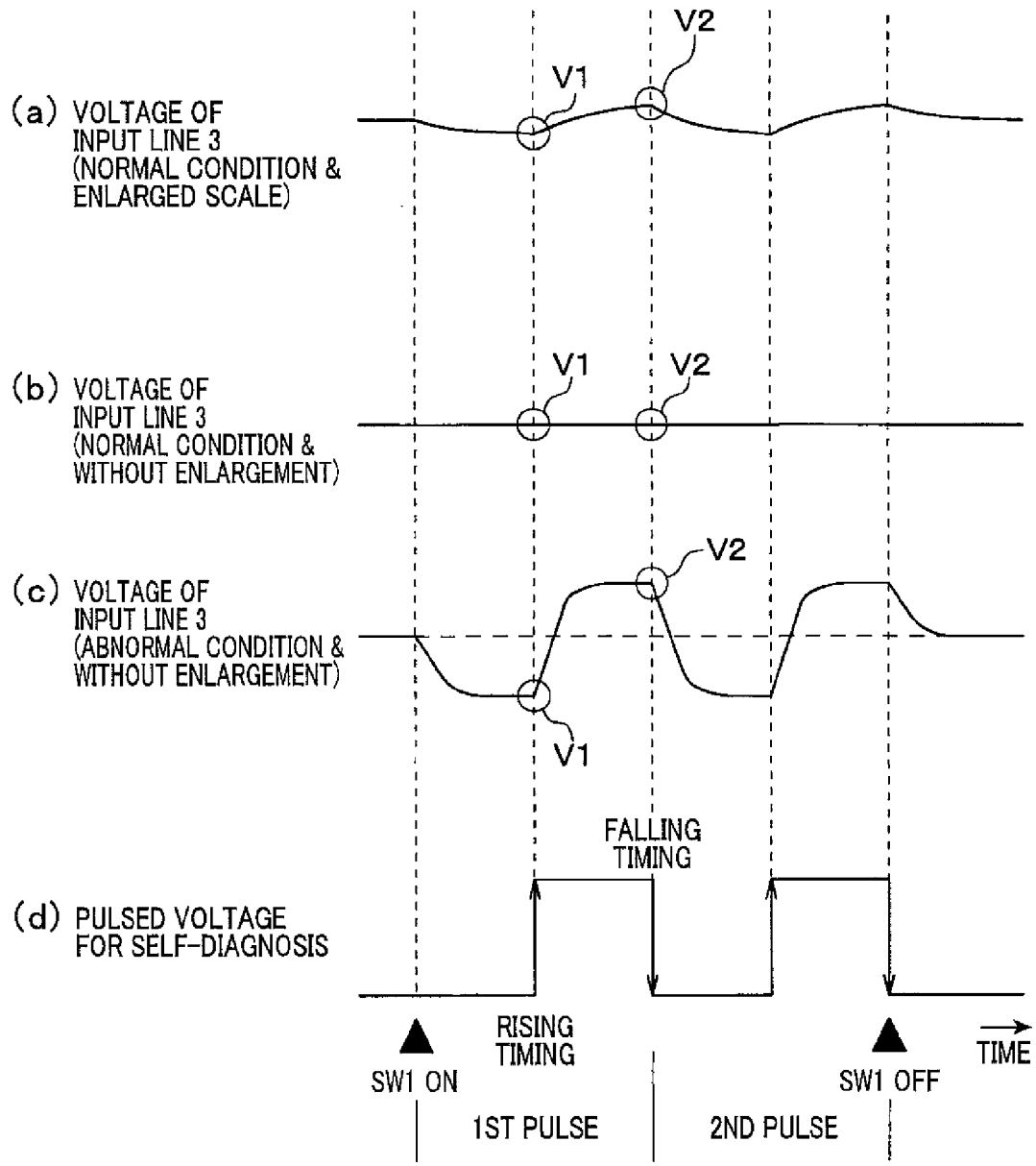

PROCESSING CIRCUIT HAVING SELF-DIAGNOSIS FUNCTION

CROSS-REFERENCE TO RELATED APPLICATION

This application is based on and claims priority from Japanese Patent Application No. 2013-77929 filed on Apr. 3, 2013, the content of which is hereby incorporated by reference in its entirety into this application.

BACKGROUND

1. Technical Field

The present invention relates to a processing circuit to which an input signal is inputted via a circuit having an external capacitor, such as a filter circuit.

2. Description of the Related Art

Conventionally, for removing noise from an input signal when the input signal is inputted to a processing circuit that is configured with an IC (Integrated Circuit), a filter circuit that includes an external capacitor is provided in an input line (or input path) between an input signal generator and the processing circuit. With such a processing circuit, a connecting wire may be detached from an input terminal of the processing circuit via which the input signal is inputted, resulting in an open fault of the input terminal. Moreover, the external capacitor of the filter circuit may be detached from the input line, resulting in an open fault of the external capacitor. Furthermore, the capacitance of the external capacitor may be lowered, resulting in a capacitance-drop fault of the external capacitor. Therefore, it is required to detect those faults occurring with the processing circuit.

One method of detecting the above-described faults is to employ two processing circuits and compare the input signals respectively inputted into the two processing circuits. However, with this method, the use of the two processing circuits makes the overall circuit configuration complicated, resulting in an increase in the manufacturing cost.

On the other hand, Japanese Unexamined Patent Application Publication No. 2012-145410 discloses another method of detecting the above-described faults. According to this method, a checking capacitor is employed for a single processing circuit to constantly check whether the external capacitor is in an open-fault condition. Specifically, the checking capacitor, which is provided outside the processing circuit, is first charged and then connected to an input terminal of the processing circuit, thereby causing electric charges to flow from the checking capacitor to the external capacitor. Further, a change in the voltage of an input line connected to the input terminal is detected; the change is caused by the flow of electric charges. Furthermore, based on the change in the voltage of the input line, it is determined whether the external capacitor is in the open-fault condition. More specifically, if the voltage of the input line is changed to reach the same level as the charge voltage of the checking capacitor, then the external capacitor is determined as being in the open-fault condition. Otherwise, the external capacitor is determined as being in a normally-connected condition.

However, with the above method disclosed in the patent document, high-frequency noise may be generated during the charging of the checking capacitance and/or during the flow of electric charges from the checking capacitance to the external capacitance.

Moreover, considering the influence of parasitic capacitance existing in the processing circuit, it is desirable to set the capacitance of the checking capacitor to be higher than the parasitic capacitance. In this case, however, the cost of the checking capacitor would be increased.

Alternatively, one may consider setting the capacitance of the checking capacitor to be lower than the parasitic capacitance and charging the checking capacitor for a plurality of times. In this case, however, it would be difficult to secure a fast checking speed.

SUMMARY

According to an exemplary embodiment, there is provided a processing circuit that has an input terminal to which an input signal generated by an input signal generator is inputted via an input line between the input signal generator and the input terminal. The processing circuit is configured to perform a predetermined process for the input signal. An external capacitor is connected to the input line in parallel with the processing circuit. The processing circuit includes a pulse circuit, at least one switch, a controller, a detector and a determiner. The pulse circuit is configured to generate a pulsed voltage having at least one pulse. The at least one switch is provided between the pulse circuit and the input line. The controller controls the at least one switch so as to apply the pulsed voltage generated by the pulse circuit to the input line via a resistor. The detector is configured to detect a change in a voltage of the input line caused by application of the pulsed voltage to the input line. The determiner determines whether the processing circuit is in a normal condition or in an abnormal condition based on the change detected by the detector.

With the above configuration, it is possible for the processing circuit to self-diagnose whether it is in the normal or abnormal condition based only on the change in the voltage of the input line caused by the application of the pulsed voltage to the input line. Therefore, it is unnecessary to charge a checking capacitor and cause electrical charges to flow from the checking capacitor to the external capacitor. Consequently, it is possible to secure a fast self-diagnosis speed and prevent high-frequency noise from being generated during the self-diagnosis. Moreover, since the change in the voltage of the input line is caused by the application of the pulsed voltage to the input line via the resistor, it is possible to minimize the influence of the parasitic capacitance on the self-diagnosis. In addition, by applying the pulsed voltage to the input line with a short period for a minimum necessary number of times, it is possible to constantly perform the self-diagnosis while suppressing change in the voltage on the input signal side.

In a further implementation, the pulsed voltage generated by the pulse circuit has a plurality of pulses. The detector is configured to detect, as the change in the voltage of the input line, the difference between a first value of the voltage of the input line at one of falling timings of the pulses of the pulsed voltage generated by the pulse circuit and a second value of the voltage of the input line at one of rising timings of the pulses of the pulsed voltage. The determiner determines the processing circuit as being in the normal condition when the difference between the first and second values of the voltage of the input line detected by the detector is less than or equal to a predetermined threshold and as being in the abnormal condition when the difference is greater than the predetermined threshold.

Further, the first value of the voltage of the input line may be at the falling timing of a first one of the pulses of the pulsed voltage, and the second value of the voltage of the input line may be at the rising timing of a second one of the pulses of the pulsed voltage. Alternatively, the first and second values of the voltage of the input line may be respectively at the rising and falling timings of a same one of the pulses of the pulsed voltage.

The abnormal condition of the processing circuit may include at least one of an open fault of the external capacitor, a capacitance-drop fault of the external capacitor and an open fault of the input terminal of the processing circuit.

The processing circuit may selectively operate either in a normal mode or in a self-diagnosis mode. In the normal mode, the processing circuit performs the predetermined process for the input signal. In the self-diagnosis mode, the processing circuit self-diagnoses whether it is in the normal or abnormal condition.

Moreover, the processing circuit may further include: a first S/H (Sample and Hold) circuit that samples and holds the input signal generated by the input signal generator in the normal mode of the processing circuit; a second S/H circuit that samples and holds the voltage of the input line at one of falling timings of the pulses of the pulsed voltage generated by the pulse circuit in the self-diagnosis mode of the processing circuit; a third S/H circuit that samples and holds the voltage of the input line at one of rising timings of the pulses of the pulsed voltage generated by the pulse circuit in the self-diagnosis mode of the processing circuit; an AD (Analog-to-Digital) converter; and a control switch provided between the first to the third S/H circuits and the AD converter. The controller may control the control switch so as to allow only the input signal sampled and held by the first S/H circuit to be inputted to the AD converter in the normal mode, only the voltage of the input line sampled and held by the second S/H circuit to be inputted to the AD converter at the falling timing of the pulsed voltage in the self-diagnosis mode and only the voltage of the input line sampled and held by the third S/H circuit to be inputted to the AD converter at the rising timing of the pulsed voltage in the self-diagnosis mode. The AD converter may AD-convert each of the input signal sampled and held by the first S/H circuit, the voltage of the input line sampled and held by the second S/H circuit and the voltage of the input line sampled and held by the third S/H circuit to obtain a digital signal and output the obtained digital signal. The detector may detect, as the change in the voltage of the input line, a difference between the digital signals outputted from the AD converter which respectively indicate the voltage of the input line sampled and held by the second S/H circuit and the voltage of the input line sampled and held by the third S/H circuit. The determiner may determine the processing circuit as being in the normal condition when the difference detected by the detector is less than or equal to a predetermined threshold and as being in the abnormal condition when the difference is greater than the predetermined threshold.

It is preferable that the controller controls the at least one switch to select one of a plurality of resistors having different electrical resistances as the resistor via which the pulsed voltage generated by the pulse circuit is applied to the input line.

BRIEF DESCRIPTION OF THE DRAWINGS

The present invention will be understood more fully from the detailed description given hereinafter and from the accompanying drawings of exemplary embodiments, which, however, should not be taken to limit the invention to the specific embodiments but are for the purpose of explanation and understanding only.

In the accompanying drawings:

FIG. 2 is a time chart illustrating an input signal that is generated by an input signal generator and inputted to the processing circuit via an input line;

FIG. 3 is a time chart illustrating a pulsed voltage generated by a pulse circuit of the processing circuit and the change with time of the voltage of the input line both when the processing circuit is in a normal condition and operates in a self-diagnosis mode and when the processing circuit is in an abnormal condition and operates in the self-diagnosis mode;

FIG. 5 is a time chart illustrating a modification of the first embodiment.

DESCRIPTION OF EMBODIMENTS

Figure 1:
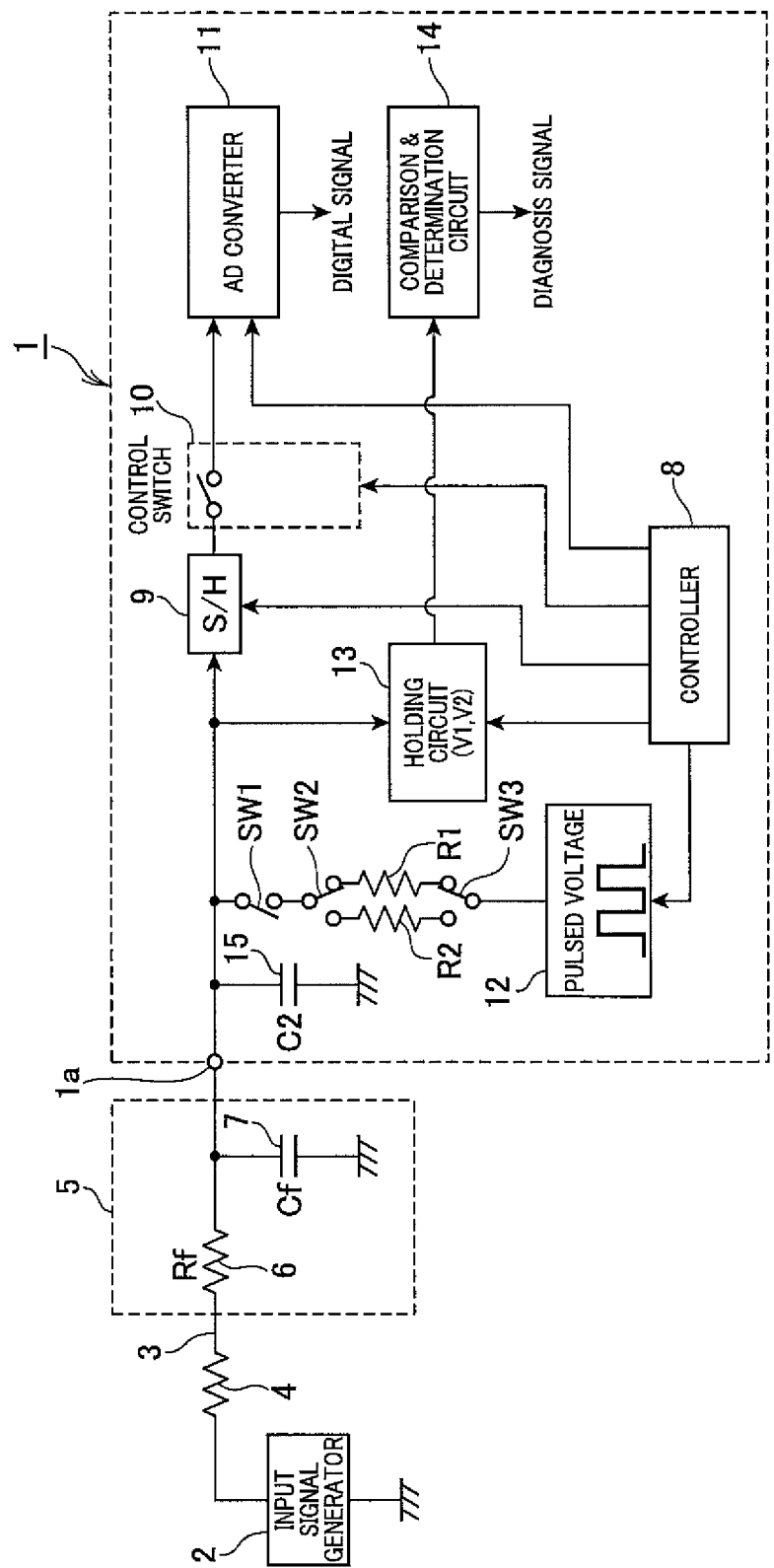
FIG. 1 is a schematic view illustrating the configuration of a processing circuit according to a first embodiment.

Exemplary embodiments will be described hereinafter with reference to FIGS. 1-5. It should be noted that for the sake of clarity and understanding, identical components having identical functions throughout the whole description have been marked, where possible, with the same reference numerals in each of the figures and that for the sake of avoiding redundancy, descriptions of the identical components will not be repeated.

First Embodiment

FIG. 1 shows the configuration of a processing circuit 1 according to a first embodiment.

In the present embodiment, the processing circuit 1 is configured to receive an input signal in an analog form, convert the input signal into a digital signal and then output the digital signal to an external circuit or device. By way of example, the processing circuit 1 may be included in a brake ECU (Electronic Control Unit) for a motor vehicle which performs a brake hydraulic control. In this case, the processing circuit 1 receives, as the input signal, a sensing signal outputted from a pressure sensor or an acceleration sensor, performs an AD (Analog-to-Digital) conversion for the sensing signal, and then outputs the obtained digital signal that is indicative of the sensing results of the sensor.

As shown in FIG. 1, the processing circuit 1 is connected to an input signal generator 2 (e.g., a pressure sensor or an acceleration sensor as described above) via an input line 3. In the input line 3, both an output-protection resistor 4 and a filter circuit 5 are connected between the input signal generator 2 and an input terminal 1a of the processing circuit 1.

The filter circuit 5 is configured with an external resistor 6 and an external capacitor 7, which together make up an RC filter. The external resistor 6 is connected in serial with the processing circuit 1, whereas the external capacitor 7 is connected in parallel with the processing circuit 1.

It should be noted that hereinafter, the term "external" denotes "provided outside and thus external to the processing circuit 1".

The processing circuit 1 is configured with an IC and connected via its input terminal 1a to the input line 3.

Specifically, in the present embodiment, the processing circuit 1 includes a controller 8, an S/H (Sample and Hold) circuit 9, a control switch 10 and an AD converter 11. The components to 9-11 are provided to together perform the normal function of the processing circuit 1, i.e., AD-converting the input signal and outputting the obtained digital signal. The processing circuit 1 also includes a pulse circuit 12, switches SW1-SW3, first and second resistors R1 and R2, a hold circuit 13 and a comparison and determination circuit 14, all of which are provided to together perform a self-diagnosis function of the processing circuit 1.

The controller 8 outputs control signals to the S/H circuit 9, the control switch 10 and the AD converter 11, thereby controlling those components 9-11 to AD-convert the input signal and output the obtained digital signal with a predetermined sampling period. The controller 8 also controls the pulse circuit 12, the switches SW1-SW3, the first and second resistors R1 and R2, the hold circuit 13 and the comparison and determination circuit 14 to perform the function of self-diagnosing whether the processing circuit 1 is in a normal or abnormal condition.

The S/H circuit 9 samples the input signal with the predetermined sampling period according to the control signal from the controller 8.

The control switch 10 controls the electrical connection between the S/H circuit 9 and the AD converter 11, thereby selectively allowing the input signal sampled by the S/H circuit 9 to be inputted to the AD converter 11.

The AD converter 11 includes a plurality of comparators (not shown). With the comparators, the AD converter 11 makes comparison for the input signal that is in the analog form and sampled by the S/H circuit 9 and outputs a digital signal representing the comparison results.

The pulse circuit 12 generates a pulsed voltage (or pulse signal) for the self-diagnosis of the processing circuit 1 according to the control signal from the controller 8. More specifically, the pulse circuit 12 generates, as the voltage for the self-diagnosis, a pulsed, predetermined positive voltage (e.g., 5 v) with a short period for a plurality of times. The pulsed voltage generated by the pulse circuit 12 is then applied to the input line 3 via either of the first and second resistors R1 and R2.

The switches SW1-SW3 are provided for controlling the application of the pulsed voltage generated by the pulse circuit 12 to the input line 3. More specifically, at a time instant Ta at which the pulse circuit 12 starts generating the pulsed voltage, the switch SW1 is turned on and the switches SW2 and SW3 are operated by the controller 8 so as to apply the pulsed voltage generated by the pulse circuit 12 to the input line 3 via a selected one of the first and second resistors R1 and R2.

The first and second resistors R1 and R2, which have different electrical resistances, are provided for imparting to the processing circuit 1 versatility with respect to the filter circuit 5. More specifically, the range of electrical resistance allowed to be connected to the input line 3 depends on the electrical resistance Rf of the external resistor 6 and the capacitance Cf of the external capacitor 7. Therefore, the controller 8 determines, based on the electrical resistance Rf and the capacitance Cf, which one of the first and second resistors R1 and R2 should be selected to be connected to the input line 3; then, the controller 8 controls the switches SW2 and 5W3 so as to apply the pulsed voltage generated by the pulse circuit 12 to the input line 3 via the selected one of the first and second resistors R1 and R2.

The holding circuit 13 holds the values of the voltage of the input line 3 respectively at predetermined holding timings according to the control signal from the controller 8. More specifically, in the present embodiment, a first holding timing T1 is set to the falling timing of a first pulse of the voltage generated by the pulse circuit 12 and a second holding timing T2 is set to the rising timing of a second pulse of the voltage. The holding circuit 13 holds the values of the voltage of the input line 3 respectively at the first and second holding timings T1 and T2 as first and second voltages V1 and V2 (see FIG. 3).

The comparison and determination circuit 14 acquires both the first and second voltages V1 and V2 held by the holding circuit 13, compares them and determines whether the processing circuit 1 is in the normal or abnormal condition based on the result of the comparison. More specifically, the comparison and determination circuit 14 calculates the difference (V1−V2) between the first and second voltages V1 and V2 and determines whether the calculated difference (V1−V2) is less than or equal to a predetermined threshold Th. Further, the comparison and determination circuit 14 determines the processing circuit 1 as being in the normal condition if the difference (V1−V2) is less than or equal to the predetermined threshold Th and as being in the abnormal condition otherwise. Then, the comparison and determination circuit 14 outputs, to the external circuit or device, a diagnosis signal indicating whether the processing circuit 1 is diagnosed (or determined) as being in the normal or abnormal condition.

In addition, in FIG. 1, the reference numeral 15 designates the parasitic capacitance existing in the processing circuit 1. The parasitic capacitance 15 has a value of C2, and the capacitance Cf of the external capacitor 7 is set to be considerably higher than C2.

As described above, in the present embodiment, the filter circuit 5 is connected to the input line 3 via which the input signal generated by the input signal generator 2 is inputted to the processing circuit 1. Moreover, the processing circuit 1 selectively operates either in a normal mode or a self-diagnosis mode. In the normal mode, the processing circuit 1 performs the AD conversion for the input signal and outputs the obtained digital signal to the external circuit or device. Consequently, the external circuit or device can perform various controls based on the digital signal outputted from the processing circuit 1. For example, in the cased of the processing signal 1 being included in a brake ECU, the brake ECU can perform a brake hydraulic control based on the digital signal outputted from the processing circuit 1. On the other hand, in the self-diagnosis mode, the processing circuit 1 diagnoses by itself whether it is in the normal or abnormal condition and outputs to the external circuit or device the diagnosis signal indicating the result of the diagnosis. Consequently, when the processing circuit 1 is in the abnormal condition, the external circuit or device can take emergency measures, such as stopping the various controls performed in the normal mode. In addition, the processing circuit 1 is diagnosed as being in the abnormal condition when there has occurred at least one of the open fault of the external capacitor 7, the capacitance-drop fault of the external capacitor 7 and the open fault of the input terminal is of the processing circuit 1.

Next, operation of the processing circuit 1 according to the present embodiment will be described in detail with reference to FIGS. 2 and 3.

As shown in FIG. 2, the input signal generator 2 generates the input signal in the analog form, the strength of which is in the range of, for example, 0 to 5V.

In the normal mode of the processing circuit 1, the input signal generated by the input signal generator 2 is inputted to the processing circuit 1 via the input line 3. Then, in the processing circuit 1, the input signal is sampled by the S/H circuit 9 with the predetermined sampling period, inputted to the AD converter 11 via the control switch 10, and AD-converted to produce the digital signal.

Referring now to FIG. 3, at the time instant Ta, the controller 8 of the processing circuit 1 shifts the operation of the processing circuit 1 from the normal mode to the self-diagnosis mode. More specifically, the controller 8 outputs the control signal to the pulse circuit 12, thereby causing the pulse circuit 12 to output the pulsed voltage for the self-diagnosis of the processing circuit 1. At the same time, the controller 8 turns the switch SW1 on and controls the switches SW2 and SW3 so as to apply the pulsed voltage generated by the pulse circuit 12 to the input line 3 via the selected one of the first and second resistors R1 and R2. Consequently, the voltage of the input line 3 comes to change with the pulsed voltage generated by the pulse circuit 12.

In addition, in FIG. 3, (*a*) shows the change with time of the voltage of the input line 3 in an enlarged scale when the processing circuit 1 is in the normal condition and operates in the self-diagnosis mode; (*b*) shows the change with time of the voltage of the input line 3 without enlargement when the processing circuit 1 is in the normal condition and operates in the self-diagnosis mode; (*c*) shows the change with time of the voltage of the input line 3 without enlargement when the processing circuit 1 is in the abnormal condition and operates in the self-diagnosis mode; and (*d*) shows the waveform of the pulsed voltage generated by the pulse circuit 12.

In the self-diagnosis mode of the processing circuit 1, when the processing circuit 1 is in the normal condition, the time constant of rising of the voltage of the input line 3 depends on the capacitance Cf of the external capacitor 7, the value C2 of the parasitic capacitance 15 and the selected one of the first and second resistors R1 and R2. Consequently, the variation in the voltage of the input line 3 (or the voltage at the input terminal is of the processing circuit 1) is so small that it can be recognized in an enlarged scale as shown in FIG. 3(*a*), but can be hardly recognized in a normal (or non-enlarged) scale. In addition, the processing circuit 1 is in the normal condition when the external capacitor 7 is normally connected with the input line 3, the capacitance Cf of the external capacitor 7 is not lower than a minimum allowable value and the input terminal is of the processing circuit 1 is normally connected to the input line 3.

In contrast, when the processing circuit 1 is in the abnormal condition, the time constant of rising of the voltage of the input line 3 depends only on the value C2 of the parasitic capacitance 15 and the selected one of the first and second resistors R1 and R2. Consequently, as shown in FIGS. 3(*c*) and (*d*), the variation in the voltage of the input line 3 is so large as to be almost identical to the variation in the pulsed voltage for the self-diagnosis generated by the pulse circuit 12.

In view of the above, in the present embodiment, the holding circuit 13 of the processing circuit 1 holds the values of the voltage of the input line 3 respectively at the falling timing T1 of the first pulse and the rising timing T2 of the second pulse of the pulsed voltage for the self-diagnosis as the first and second voltages V1 and V2. The comparison and determination circuit 14 of the processing circuit 1 calculates the difference (V1-V2) between the first and second voltages V1 and V2, compares the calculated difference (V1-V2) with the predetermined threshold Th and determines whether the processing circuit 1 is in the normal or abnormal condition based on the result of the comparison.

As shown in FIGS. 3(*c*) and (*d*), the first voltage V1 represents the value of the voltage of the input line 3 when the voltage has risen to reach its positive peak by the application of the first pulse of the pulsed voltage for the self-diagnosis to the input line 3, whereas the second voltage V2 represents the value of the voltage of the input line 3 when the voltage has fallen to reach its negative peak after the end of the first pulse of the pulsed voltage for the self-diagnosis. Therefore, when the processing circuit 1 is in the normal condition, the difference (V1-V2) will be small as shown in FIG. 3(*b*). In contrast, when the processing circuit 1 is in the abnormal condition, the difference (V1-V2) will be large as shown in FIG. 3(*d*). Accordingly, it is possible to diagnose the processing circuit 1 based on the comparison between the difference (V1-V2) and the predetermined threshold Th. More specifically, the processing circuit 1 can be diagnosed as being in the normal condition if (V1-V2) is less than or equal to Th and as being in the abnormal condition otherwise.

According to the present embodiment, it is possible to achieve the following advantageous effects.

In the present embodiment, the processing circuit 1 has the input terminal is to which the input signal generated by the input signal generator 2 is inputted via the input line 3 between the input signal generator 2 and the input terminal 1*a*. The processing circuit 1 is configured to perform the AD conversion for the input signal that is in the analog form and output the obtained digital signal to the external circuit or device. Further, the external capacitor 7 is connected to the input line 3 in parallel with the processing circuit 1. The processing circuit 1 includes the pulse circuit 12, the switches SW1-SW3, the controller 8, a detector and the comparison and determination circuit 14. The pulse circuit 12 is configured to generate the pulsed voltage having the plurality of pulses. The switches SW1-SW3 are provided between the pulse circuit 12 and the input line 3. The controller 8 controls the switches SW1-SW3 so as to apply the pulsed voltage generated by the pulse circuit 12 to the input line 3 via the selected one of the first and second resistors R1 and R2. The detector detects a change in the voltage of the input line 3 caused by the application of the pulsed voltage to the input line 3. The comparison and determination circuit 14 determines whether the processing circuit 1 is in the normal or abnormal condition based on the change detected by the detector.

More particularly, in the present embodiment, the detector is made up of the holding circuit 13 and part of the comparison and determination circuit 14. The detector detects, as the change in the voltage of the input line 3, the difference (V1-V2) between the first voltage V1 of the input line 3 at the falling timing T1 of the first pulse of the pulsed voltage generated by the pulse circuit 12 and the second voltage V2 of the input line 3 at the rising timing T2 of the second pulse of the pulsed voltage. The comparison and determination circuit 14 determines the processing circuit 1 as being in the normal condition when the difference (V1-V2) is less than or equal to the predetermined threshold Th and as being in the abnormal condition when the difference (V1-V2) is greater than the predetermined threshold Th.

With the above configuration, it is possible for the processing circuit 1 to self-diagnose whether it is in the normal or abnormal condition based only on the change in the voltage of the input line 3 caused by the application of the pulsed voltage to the input line 3. Therefore, unlike in the case of using the method disclosed in Japanese Unexamined Patent Application Publication No. 2012-145410, it is unnecessary to charge a checking capacitor and cause electrical charges to flow from the checking capacitor to the external capacitor 7. Consequently, it is possible to secure a fast self-diagnosis speed and prevent high-frequency noise from being generated during the self-diagnosis. Moreover, since the change in the voltage of the input line 3 is caused by the application of the pulsed voltage to the input line 3 via the selected one of the first and second resistors R1 and R2, it is possible to minimize the influence of the parasitic capacitance 15 on the self-diagnosis. In addition, by applying the pulsed voltage to the input line 3 with the short period for a minimum necessary number of times, it is possible to constantly perform the self-diagnosis while suppressing change in the voltage on the input signal side.

Moreover, in the present embodiment, the controller 8 controls the switches SW1-SW3 to select one of the first and second resistors R1 and R2 that have the different electrical resistances, thereby applying the pulsed voltage generated by the pulse circuit 12 to the input line 3 via the selected one of the first and second resistors R1 and R2.

With the above configuration, it is possible to impart to the processing circuit 1 versatility with respect to the filter circuit 5.

Second Embodiment

This embodiment illustrates a processing circuit 1 which has a similar configuration to the processing circuit 1 according to the first embodiment; accordingly, only the differences therebetween will be described hereinafter.

Figure 4:
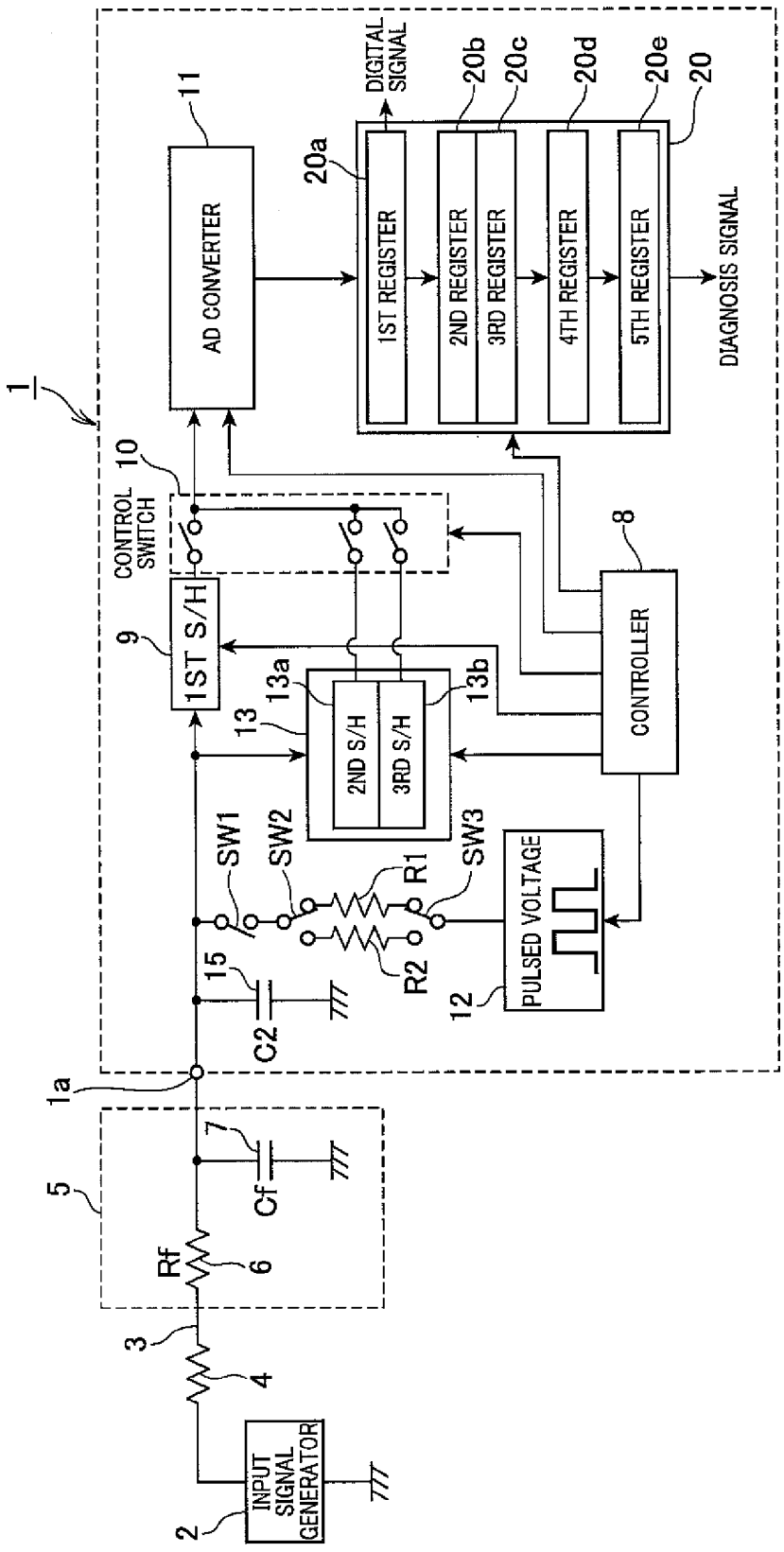
FIG. 4 is a schematic view illustrating the configuration of a processing circuit according to a second embodiment.

As shown in FIG. 4, in the present embodiment, the processing circuit 1 includes three S/H (Sample and Hold) circuits. The first S/H circuit 9 is identical to the S/H circuit 9 in the first embodiment. That is, the first S/H circuit 9 samples and holds the input signal generated by the input signal generator 2. On the other hand, both the second and third S/H circuits 13a and 13b sample and hold the voltage of the input line 3. The second and third S/H circuits 13a and 13b together make up the holding circuit 13. In other words, in the present embodiment, the holding circuit 13 is configured with the second and third S/H circuits 13a and 13b.

Moreover, in the present embodiment, the control switch 10 is configured with a multiplexer to select one of the voltages held by the first to the third S/H circuits 9 and 13a-13b and thereby allow only the selected one of the voltages to be inputted to the AD converter 11.

Furthermore, in the present embodiment, the processing circuit 1 includes a register unit 20 instead of the comparison and determination circuit 14. The register unit 20 receives the digital signals outputted from the AD converter 11 and hold data indicated by the digital signals.

More specifically, the register unit 20 includes first to fifth registers 20a to 20e. The first register 20a holds and outputs to the external circuit or device the result of AD-converting the input signal sampled and held by the first S/H circuit 9. The second register 20b holds and outputs the result of AD-converting the voltage of the input line 3 sampled and held by the second S/H circuit 13a. The third register 20c holds and outputs the result of AD-converting the voltage of the input line 3 sampled and held by the third S/H circuit 13b. The fourth register 20d calculates and holds the difference between the AD conversion results respectively held by the second and third registers 20b and 20c. The fifth register 20e determines whether the processing circuit 1 is in the normal or abnormal condition based on the difference held by the fourth register 20d, holds the determination result and outputs the diagnosis signal indicating the determination result.

Next, operation of the processing circuit 1 according to the present embodiment will be described.

In the normal mode of the processing circuit 1, the controller 8 controls the control switch 10 to allow only the voltage held by the first S/H circuit 9 to be inputted to the AD converter 11. In addition, the controller 8 also sends a control signal to the register unit 20, thereby informing the register unit 20 that the processing circuit 1 operates in the normal mode.

Upon receipt of the voltage held by the first S/H circuit 9, the AD converter 11 performs the AD conversion for the voltage and outputs the obtained digital signal to the register unit 20. Then, the first register 20a of the register unit 20 holds and outputs to the external circuit or device the digital signal that is indicative of the input signal generated by the input signal generator 2.

In the self-diagnosis mode, the controller 8 controls the pulse circuit 12 to generate the pulsed voltage for the self-diagnosis. At the same time, the controller 8 turns the switch SW1 on and controls the switches SW2 and SW3 so as to apply the pulsed voltage generated by the pulse circuit 12 to the input line 3 via the selected one of the first and second resistors R1 and R2. Consequently, the voltage of the input line 3 comes to change with the pulsed voltage generated by the pulse circuit 12, as described previously in the first embodiment with reference to FIG. 3. In addition, the controller 8 also sends the control signal to the register unit 20, thereby informing the register unit 20 that the processing circuit 1 operates in the self-diagnosis mode.

Further, at the falling timing T1 of the first pulse of the pulsed voltage generated by the pulse circuit 12, the controller 8 controls the second S/H circuit 13a to hold the voltage of the input line 3. At the same time, the controller 8 controls the control switch 10 to allow only the voltage held by the second S/H circuit 13a to be inputted to the AD converter 11. Upon receipt of the voltage outputted from the second S/H circuit 13a, the AD converter 11 performs the AD conversion for the voltage and outputs the obtained digital signal to the register unit 20. Then, the second register 20b of the register unit 20 holds and outputs to the fourth register 20d the digital signal that is indicative of the voltage of the input line 3 at the falling timing T1.

Similarly, at the rising timing T2 of the second pulse of the pulsed voltage generated by the pulse circuit 12, the controller 8 controls the third S/H circuit 13b to hold the voltage of the input line 3. At the same time, the controller 8 controls the control switch 10 to allow only the voltage held by the third S/H circuit 13b to be inputted to the AD converter 11. Upon receipt of the voltage outputted from the third S/H circuit 13b, the AD converter 11 performs the AD conversion for the voltage and outputs the obtained digital signal to the register unit 20. Then, the third register 20c of the register unit 20 holds and outputs to the fourth register 20d the digital signal that is indicative of the voltage of the input line 3 at the rising timing T2.

Upon receipt of both the digital signals outputted from the second and third registers 20b and 20c, the fourth register 20d of the register unit 20 calculates the difference between the voltage of the input line 3 indicated by the digital signal outputted from the second register 20b and that indicated by the digital signal outputted from the third register 20c. Then, the fifth register 20e of the register unit 20 compares the difference calculated by the fourth register 20d with the predetermined threshold Th and determines whether the processing circuit 1 is in the normal or abnormal condition based on the result of the comparison.

According to the present embodiment, it is possible to achieve the same advantageous effects as according to the first embodiment.

While the above particular embodiments have been shown and described, it will be understood by those skilled in the art that various modifications, changes, and improvements may be made without departing from the spirit of the invention.

For example, in the previous embodiments, the processing circuit 1 is configured to perform the AD conversion for the input signal. However, the processing circuit may be configured to perform other processes for the input signal.

Moreover, in the previous embodiments, the processing circuit 1 is configured to include the first and second resistors R1 and R2 so as to have versatility with respect to the filter circuit 5. However, the processing circuit 1 may be configured to include only one resistor or three or more resistors.

In the previous embodiments, the polarities of the pulses of the pulsed voltage generated by the pulse circuit 12 are in the H (High level)-L (Low level) order (see FIG. 3). However, as shown in FIG. 5, the polarities of the pulses of the pulsed voltage may be in the L-H order.

In the first embodiment, the first and second voltages V1 and V2 are respectively represented by the values of the voltage of the input line 3 at the falling timing T1 of the first pulse and the rising timing T2 of the second pulse of the pulsed voltage generated by the pulse circuit 12 (see FIG. 3). However, as shown in FIG. 5, the first and second voltages V1 and V2 may be respectively represented by the values of the voltage of the input line 3 at the rising and falling timings of a same one of the pulsed voltage.

Furthermore, in the first embodiment, the comparison and determination circuit 14 determines whether the processing circuit 1 is in the normal or abnormal condition based on the comparison between (V1−V2) (i.e., the peak-to-peak amplitude of the waveform of the voltage of the input line 3). However, the comparison and determination circuit 14 may make the above determination based on other parameters representing the change in the voltage of the input line 3 caused by the application of the pulsed voltage generated by the pulse circuit 12 to the input line 3.

In the previous embodiments, the pulsed voltage generated by the pulse circuit 12 has the plurality of pulses, However, the pulsed voltage generated by the pulse circuit 12 may have only a single pulse. In this case, the first and second voltages V1 and V2 may be respectively represented by the values of the voltage of the input line 3 at the start and end timings of the single pulse.

What is claimed is:

1. A processing circuit having an input terminal to which an input signal generated by an input signal generator is inputted via an input line between the input signal generator and the input terminal, the processing circuit being configured to perform a predetermined process for the input signal, wherein an external capacitor is connected to the input line in parallel with the processing circuit,
the processing circuit comprising:
a pulse circuit configured to generate a pulsed voltage having at least one pulse;
at least one switch provided between the pulse circuit and the input line;
a controller that controls the at least one switch so as to apply the pulsed voltage generated by the pulse circuit to the input line via a resistor;
a detector configured to detect a change in a voltage of the input line caused by application of the pulsed voltage to the input line;
a determiner that determines whether the processing circuit is in a normal condition or in an abnormal condition based on the change detected by the detector.

2. The processing circuit as set forth in claim 1, wherein the pulsed voltage generated by the pulse circuit has a plurality of pulses,
the detector is configured to detect, as the change in the voltage of the input line, a difference between a first value of the voltage of the input line at one of falling timings of the pulses of the pulsed voltage generated by the pulse circuit and a second value of the voltage of the input line at one of rising timings of the pulses of the pulsed voltage, and
the determiner determines the processing circuit as being in the normal condition when the difference between the first and second values of the voltage of the input line detected by the to detector is less than or equal to a predetermined threshold and as being in the abnormal condition when the difference is greater than the predetermined threshold.

3. The processing circuit as set forth in claim 2, wherein the first value of the voltage of the input line is at the falling timing of a first one of the pulses of the pulsed voltage, and the second value of the voltage of the input line is at the rising timing of a second one of the pulses of the pulsed voltage.

4. The processing circuit as set forth in claim 2, wherein the first and second values of the voltage of the input line are respectively at the rising and falling timings of a same one of the pulses of the pulsed voltage.

5. The processing circuit as set forth in claim 1, wherein the abnormal condition of the processing circuit comprises at least one of an open fault of the external capacitor, a capacitance-drop fault of the external capacitor and an open fault of the input terminal of the processing circuit.

6. The processing circuit as set forth in claim 1, wherein the processing circuit operates selectively in a normal mode or a self-diagnosis mode,
in the normal mode, the processing circuit performs the predetermined process for the input signal, and
in the self-diagnosis mode, the processing circuit self-diagnoses whether it is in the normal or abnormal condition.

7. The processing circuit as set forth in claim 6, wherein the pulsed voltage generated by the pulse circuit has a plurality of pulses,
the processing circuit further comprises:
a first S/H (Sample and Hold) circuit that samples and holds the input signal generated by the input signal generator in the normal mode of the processing circuit;
a second S/H circuit that samples and holds the voltage of the input line at one of falling timings of the pulses of the pulsed voltage generated by the pulse circuit in the self-diagnosis mode of the processing circuit;
a third S/H circuit that samples and holds the voltage of the input line at one of rising timings of the pulses of the pulsed voltage generated by the pulse circuit in the self-diagnosis mode of the processing circuit;
an AD (Analog-to-Digital) converter; and
a control switch provided between the first to the third S/H circuits and the AD converter,
wherein
the controller controls the control switch so as to allow only the input signal sampled and held by the first S/H circuit to be inputted to the AD converter in the normal mode, only the voltage of the input line sampled and held by the second S/H circuit to be inputted to the AD converter at the falling timing of the pulsed voltage in the self-diagnosis mode and only the voltage of the input line sampled and held by the third S/H circuit to be inputted to the AD converter at the rising timing of the pulsed voltage in the self-diagnosis mode,
the AD converter AD-converts each of the input signal sampled and held by the first S/H circuit, the voltage of the input line sampled and held by the second S/H circuit and the voltage of the input line sampled and held by the third S/H circuit to obtain a digital signal and outputs the obtained digital signal, the detector detects, as the change in the voltage of the input line, a difference between the digital signals outputted from the AD converter which respectively indicate the voltage of the input line sampled and held by the second S/H circuit and the voltage of the input line sampled and held by the third S/H circuit, and the determiner determines the processing circuit as being in the normal condition when the difference detected by the detector is less than or equal to a predetermined threshold and as being in the abnormal condition when the difference is greater than the predetermined threshold.

8. The processing circuit as set forth in claim 1, wherein the controller controls the at least one switch to select one of a plurality of resistors having different electrical resistances as the resistor via which the pulsed voltage generated by the pulse circuit is applied to the input line.

* * * * *